(12) United States Patent
Chatani et al.

(10) Patent No.: US 12,276,039 B2
(45) Date of Patent: Apr. 15, 2025

(54) CRYSTAL OF EUROPIUM COMPOUND AND METHOD FOR PRODUCING CRYSTAL OF EUROPIUM COMPOUND

(71) Applicants: OHARA INC., Sagamihara (JP); NATIONAL UNIVERSITY CORPORATION NAGAOKA UNIVERSITY OF TECHNOLOGY, Nagaoka (JP); NATIONAL INSTITUTE OF TECHNOLOGY, Hachioji (JP)

(72) Inventors: Sunao Chatani, Wakayama (JP); Masahiko Inui, Wakayama (JP); Motohiro Tagaya, Nagaoka (JP); Takuya Kataoka, Nagaoka (JP); Satoshi Motozuka, Kitakyusyu (JP)

(73) Assignees: OHARA INC., Sagamihara (JP); NATIONAL UNIVERSITY CORPORATION NAGAOKA UNIVERSITY OF TECHNOLOGY, Nagaoka (JP); NATIONAL INSTITUTE OF TECHNOLOGY, Tokyo (JP)

( * ) Notice: Subject to any disclaimer, the term of this patent is extended or adjusted under 35 U.S.C. 154(b) by 104 days.

(21) Appl. No.: 17/911,537

(22) PCT Filed: Mar. 16, 2021

(86) PCT No.: PCT/JP2021/010644
§ 371 (c)(1),
(2) Date: Sep. 14, 2022

(87) PCT Pub. No.: WO2021/187491
PCT Pub. Date: Sep. 23, 2021

(65) Prior Publication Data
US 2023/0175165 A1 Jun. 8, 2023

(30) Foreign Application Priority Data

Mar. 17, 2020 (JP) ................... 2020-046604

(51) Int. Cl.
*C30B 1/10* (2006.01)
*C30B 29/12* (2006.01)

(52) U.S. Cl.
CPC ............... *C30B 1/10* (2013.01); *C30B 29/12* (2013.01)

(58) Field of Classification Search
CPC ......... C30B 1/10; C30B 29/12; C01F 17/224; C01F 17/271; C01F 17/259; C09K 11/02;
(Continued)

(56) References Cited

U.S. PATENT DOCUMENTS

2019/0127635 A1    5/2019   Inui et al.

FOREIGN PATENT DOCUMENTS

CN    103172102 A    6/2013
CN    107311217 A    11/2017
(Continued)

OTHER PUBLICATIONS

Mahajan et al., "Synthesis of RE(OH)2Cl and REOCl (RE=Eu, Tb) nanostructures," Journal of Rare Earths, vol. 26, No. 2, p. 131-134. (Year: 2008).*
(Continued)

*Primary Examiner* — Wayne A Langel
*Assistant Examiner* — Syed T Iqbal
(74) *Attorney, Agent, or Firm* — CANTOR COLBURN LLP (57) ABSTRACT

The present invention provides a crystal of a europium compound containing europium. The present invention enables the preparation of a crystal of a europium compound having a powder X-ray diffraction pattern having a first
(Continued)

diffraction peak in diffraction angle (2θ) range of 34.3° to 36.1° in which a half width of the first diffraction peak is 1.8° or less, and/or having a second diffraction peak in diffraction angle (2θ) range of 28.6° to 29.6° and a third diffraction peak in diffraction angle (2θ) range of 36.8° to 38.4° in which a half width of the second diffraction peak is 1.0° or less and a half width of the third diffraction peak is 1.6° or less, and being at least one compound selected from compounds represented by formulae (1) to (4):

$$EuCl_x \quad (1)$$

$$Eu(OH)_2 \quad (2)$$

$$Eu(OH)_2Cl \quad (3)$$

$$EuOCl \quad (4)$$

x is 0.05 or more and 5 or less.

4 Claims, 7 Drawing Sheets

(58) Field of Classification Search
CPC ............ C09K 11/7729; C09K 11/7732; C01P 2002/72
See application file for complete search history.

(56) References Cited

FOREIGN PATENT DOCUMENTS

| EP | 4122886 A1 | 1/2023 |
| JP | 2020033240 A | 3/2020 |
| WO | 2017170531 A1 | 10/2017 |

OTHER PUBLICATIONS

Mahajan et al. "Synthesis of RE(OH)2Cl and REOCl (Re =Eu, Tb) nanostructures" Journal of Rare Earths, vol. 26, No. 2, Apr. 2008, p. 131 (Year: 2008).*
Aitasalo et al., "Structural, magnetic and spectroscopic investigations of europium oxychloride, EuOCl", Journal of Alloys and Compounds, Elsevier Sequoia, Lausanne, CH, vol. 380, No. 1-2, Oct. 20, 2004 (Oct. 20, 2004), pp. 296-302, XP004583294.
EPO Extended European Search Report issued in the EP Patent Application No. 21770939.3, mailed on Apr. 3, 2024.
Hashimoto et al., "Synthesis and photoluminescence properties of the Eu(III)—containing silica nanoparticles via amechanochemical solid-state reaction between SiO2 and EuCl3.6H2O", Advanced Powder Technology, vol. 31, No. 8, Aug. 2, 2020 (Aug. 2, 2020), pp. 3650-3656, XP093143749Retrieved from the Internet: URL:https://pdf.sciencedirectassets.com/277410/1-s2.0-S0921883120X00082/1-s2.0-S0921883120303496/main.pdf?X-Amz-Security-Token=IQoJb3JpZ2luX2VjEAAaCXVzLWVhc3QtMSJHMEUCIHxKiyarLD1.
International Search Report for International Application No. PCT/JP2021/010644; Date of Mailing, May 18, 2021.

* cited by examiner

CRYSTAL OF EUROPIUM COMPOUND AND METHOD FOR PRODUCING CRYSTAL OF EUROPIUM COMPOUND

CROSS REFERENCE TO RELATED APPLICATIONS

This is the U.S. national stage of application No. PCT/JP2021/010644, filed on Mar. 16, 2021. Priority under 35 U.S.C. § 119 (a) and 35 U.S.C. § 365 (b) is claimed from Japanese Application No. 2020-046604, filed Mar. 17, 2020, the disclosure of which is also incorporated herein by reference.

TECHNICAL FIELD

The present invention relates to a crystal of a europium compound and a method for producing a crystal of a europium compound.

BACKGROUND ART

A europium compound containing europium is used as, for example, a light-emitting substance. Such a light-emitting substance can be used for a bioimaging technique for allowing, for example, a cell in a living body or a molecule to take up the light-emitting substance, visualizing (imaging) and analyzing the kinetics or function thereof, and the like (see Patent Document 1).

Herein, chlorides of europium, hydroxides of europium, and chloride hydroxides of europium, which are europium compounds, are amorphous. Crystals thereof are not known conventionally. If crystals of the chlorides of europium, the hydroxides of europium, and the chloride hydroxides of europium can be provided, effects and applications that are difficult to obtain in amorphous can be expected.

Patent Document 1: PCT International Publication No. WO2017/170531

DISCLOSURE OF THE INVENTION

Problems to be Solved by the Invention

The present invention has been made in view of the above-mentioned problem and has an object to provide a crystal of a europium compound containing europium and a method for producing the same.

Means for Solving the Problems

The present inventors have completed the present invention based on the finding that a crystal of a europium compound can be produced by mixing a silicate-based base material with europium chloride (III) hexahydrate, such that a percentage of the number of moles of the elemental europium with respect to the total number of moles of the elemental silicon of the silicate-based base material and the elemental europium is 1.0 mol % or more and carrying out a solid-phase mechanochemical reaction under a load of 4 N or more and 24 N or less, the silicate-based base material containing elemental silicon (Si) and elemental oxygen (O), and having a solid $^{29}$Si-NMR spectrum satisfying $Q_4/Q_3$ of 2.0 to 3.9 where $Q_4$ represents a peak area derived from $Si(OSi)_4$ and $Q_3$ represents a peak area derived from HO—Si(OSi)$_3$. In other words, the present invention includes the following configurations.

[1] A crystal of a europium compound containing europium,
having a powder X-ray diffraction pattern having a first diffraction peak in a diffraction angle (2θ) range of 34.3° to 36.1° in which a half value width of the first diffraction peak is 1.8° or less, and/or having a second diffraction peak in a diffraction angle (2θ) range of 28.6° to 29.6° and a third diffraction peak in a diffraction angle (2θ) range of 36.8° to 38.4° in which a half value width of the second diffraction peak is 1.0° or less and a half value width of the third diffraction peak is 1.6° or less, and
being at least one compound selected from compounds represented by the following chemical formulae (1) to (4):

$$EuCl_x \quad (1)$$

$$Eu(OH)_2 \quad (2)$$

$$Eu(OH)_2Cl \quad (3)$$

$$EuOCl \quad (4)$$

(in the formula (1), x is 0.05 or more and 5 or less).

[2] A method for producing the crystal of a europium compound as described in the above [1], the method including:
mixing a silicate-based base material and europium chloride (III) hexahydrate with each other to carry out a solid-phase mechanochemical reaction,
in which the silicate-based base material contains elemental silicon (Si) and elemental oxygen element (O), and has a solid $^{29}$Si-NMR spectrum satisfying $Q_4/Q_3$ of 2.0 to 3.9 where $Q_4$ represents a peak area derived from $Si(OSi)_4$ and $Q_3$ represents a peak area derived from HO—Si(OSi)$_3$, and
the solid-phase mechanochemical reaction is carried out by adding europium chloride (III) hexahydrate such that a percentage of a number of moles of elemental europium with respect to a total number of moles of elemental silicon of the silicate-based base material and elemental europium is 1.0 mol % or more, and under a load of 4 N or more and 24 N or less.

Effects of the Invention

The present invention can provide a crystal of europium chloride, europium hydroxide, and chloride hydroxide of europium.

PREFERRED MODE FOR CARRYING OUT THE INVENTION

Hereinafter, the present invention will be described in more detail.

<Crystal of Europium Compound>

A crystal of a europium compound of the present invention has a powder X-ray diffraction pattern having a first diffraction peak in a diffraction angle (2θ) range of 34.3° to 36.1° in which a half value width (half width) of the first diffraction peak is 1.8° or less, and/or having a second diffraction peak in a diffraction angle (2θ) range of 28.6° to 29.6° in which a half value width of the second diffraction peak is 1.0° or less, and a third diffraction peak in a diffraction angle (2θ) range of 36.8° to 38.4° in which a half value width of the third diffraction peak is 1.6° or less.

The crystal of the europium compound of the present invention includes at least one compound selected from the compounds represented by the chemical formulae (1) to (4).

$$EuCl_x \quad (1)$$

$$Eu(OH)_2 \quad (2)$$

$$Eu(OH)_2Cl \quad (3)$$

$$EuOCl \quad (4)$$

(In the formula (1), x is 0.05 or more and 5 or less.)

The crystal of the europium compound of the present invention may have a first diffraction peak in a diffraction angle (2θ) range of 34.3° to 36.1° in which a half value width of the first diffraction peak is 1.8° or less; may have a second diffraction peak in a diffraction angle (2θ) range of 28.6° to 29.6° in which a half value width of the second diffraction peak is 1.0° or less, and a third diffraction peak in a diffraction angle (2θ) range of 36.8° to 38.4° in which the half value width of the third diffraction peak is 1.6° or less; and may have a first diffraction peak in a diffraction angle (2θ) range of 34.3° to 36.1° in which a half value width of the first diffraction peak is 1.8° or less, a second diffraction peak in a diffraction angle (2θ) range of 28.6° to 29.6° in which a half value width of the second diffraction peak is 1.0° or less and a third diffraction peak in a diffraction angle (2θ) range of 36.8° to 38.4° in which a half value width of the third diffraction peak may be 1.6° or less. The half value width of the first diffraction peak is preferably 1.1° or less. The half value width of the second diffraction peak is preferably 0.6° or less. The half value width of the third diffraction peak is preferably 1.0° or less. The first diffraction peak is derived from a crystal of the compound represented by the chemical formula (1) or (2). The second diffraction peak and the third diffraction peak are derived from a crystal of the compound represented by the chemical formula (3) or (4). In the chemical formula (1), x is preferably 0.2 or more and 0.6 or less.

The description "having a diffraction peak in a diffraction angle (2θ) range of a° to b°" means that a peak top position of the diffraction peak (a diffraction peak top position) is within a range of a° to b°. Therefore, for example, in a broad peak, all of the peaks from an end portion to another end portion are not necessarily required to be included within a range of a° to b°.

Furthermore, the crystals of the europium compounds may have a different peak other than the above specific diffraction peaks. For example, the compound represented by the chemical formula (1) or (2) may also have a diffraction peak in a diffraction angle (2θ) range of 25.9° to 26.5° and a diffraction peak in a diffraction angle (2θ) range of 31.6° to 32.2°. The diffraction peak in a diffraction angle (2θ) range of 25.9° to 26.5° and the diffraction peak in a diffraction angle (2θ) range of 31.6° to 32.2° respectively have preferably a half value width of 0.6° or less, and further preferably 0.4° or less. The crystals of the compound represented by the chemical formula (3) or (4) may also have a diffraction peak in a diffraction angle (2θ) range of 39.0° to 40.2°. The half value width of the diffraction peak in a diffraction angle (2θ) range of 39.0° to 40.2° is preferably 1.2° or less, and further preferably 0.8° or less.

Conventionally, crystals of the compounds represented by the above chemical formulae (1) to (4) have not been known. However, as will be described in detail later, when a specific silicate-based base material and europium chloride (III) hexahydrate are subjected to a solid-phase mechanochemical reaction under specific conditions, crystals of compounds represented by chemical formulae (1) to (4) having the specific diffraction peaks can be obtained. Note here that the "crystal" means a substance not being an amorphous, and a substance having crystallinity represented by the following formula (5) of more than 0. The crystallinity is preferably more than 0.10.

$$\text{Crystallinity} = \{\text{crystal diffraction peak area/amorphous halo diffraction peak area}\} \quad (5)$$

(In the formula (5), the "crystal diffraction peak area" is a sum of the areas of the diffraction peaks derived from the crystal in 2θ=20° to 55°; the "amorphous halo diffraction peak area" is a value obtained by subtracting the crystal diffraction peak area from the sum of the areas of all the diffraction peaks observed in 2θ=20° to 55°.)

In the crystal of the europium compound of the present invention, as compared with an amorphous, elusion of ions such as chloride ion does not easily occur, so that adverse effects caused by elusion of ions are suppressed. The crystal of the europium compound of the present invention has properties, for example, lower cytotoxicity than that of amorphous. Furthermore, the crystal of the europium compound of the present invention contains europium (III), and therefore, the crystal has a function as a light-emitting substance. The crystal of the europium compound of the present invention excites and emits light in a visible light region, and the excitation wavelength $\lambda_{ex}$ is, for example, 395 nm and 464 nm, and the fluorescence wavelength $\lambda_{em}$ is, for example, 615 nm. In this way, the crystal of the europium compound of the present invention has low cytotoxicity and functions as a light-emitting substance, and therefore, can be preferably used, for example, for a bioimaging technique. Furthermore, in the crystal of the europium compound of the present invention, since the excitation wavelength and the light-emission wavelength are in a visible light region, degradation of biological tissue and labeling material due to irradiating with light can be reduced in bioimaging, light scattering of a sample surface can be reduced, and the observation sensitivity can be increased. In a case of use for a bioimaging technique, preferably, the crystal has a spherical shape and an average particle size of about 50 nm or more and 470 nm or less.

<Method for Producing Crystal of Europium Compound>

The above-mentioned crystal of the europium compound of the present invention can be produced by a method for producing a crystal of a europium compound of the present invention, the method including mixing a silicate-based base material and europium chloride (III) hexahydrate with each other to carry out a solid-phase mechanochemical reaction, in which the silicate-based base material contains elemental silicon (Si) and elemental oxygen (O), and has a solid $^{29}$Si-NMR spectrum satisfying $Q_4/Q_3$ of 2.0 to 3.9 where $Q_4$ represents a peak area derived from $Si(OSi)_4$ and $Q_3$ represents a peak area derived from $HO—Si(OSi)_3$, and the solid-phase mechanochemical reaction is carried out by adding europium chloride (III) hexahydrate such that a percentage of a number of moles of elemental europium (Eu) with respect to a total number of moles of elemental silicon (Si) of the silicate-based base material and elemental europium (Eu) (number of moles of Eu/(number of moles of Si+number of moles of Eu)) is 1.0 mol % or more, under a load of 4 N or more and 24 N or less.

A silicate-based base material to be used for the production method of the present invention contains elemental silicon (Si) and elemental oxygen (O). The molar ratio O/Si, the ratio of O to Si in the silicate-based base material, is preferably 2.0 to 2.2. Examples of the silicate-based base material include base materials including silicon oxide such as silica, and silicate. These may be a crystal or an amorphous.

Furthermore, the silicate-based base material has a solid $^{29}$Si-NMR spectrum satisfying $Q_4/Q_3$ of 2.0 to 3.9 where $Q_4$ represents a peak area derived from $Si(OSi)_4$ and $Q_3$ represents a peak area derived from $HO—Si(OSi)_3$. $Q_4/Q_3$ is preferably 2.2 to 2.6.

The silicate-based base material containing elemental silicon (Si) and elemental oxygen (O) and satisfying $Q_4/Q_3$ of 2.0 to 3.9 can be produced by the following method. The silicate-based base material satisfying $Q_4/Q_3$ of 2.0 to 3.9 can be obtained as particulate substance (a soot body or a by-product), generated in a conventionally known production method of silica glass by the soot method (for example, production method of silica glass by VAD (Vapor phase Axial Deposition)). For example, when silicon tetrachloride as a raw material is subjected to hydrolysis reaction in an oxygen-hydrogen flame to produce silica glass as porous synthetic quartz glass (soot body), particles which did not become porous synthetic quartz glass after being hydrolyzed in an oxygen-hydrogen flame and desorbed from the flame are to be used as the silicate-based base material. By adjusting the above conditions, the above silicate-based base material is obtained. For example, silicon tetrachloride as a raw material is introduced into the center portion of the oxygen-hydrogen flame burner to adjust a flame temperature zone length and gas balance of oxygen-hydrogen gas. Specifically, nucleation and grain growth are adjusted, for example, in a range of the flame temperature zone length at 1000° C. or more: 100 mm or more and 800 mm or less, and at a volume ratio of hydrogen to oxygen ($H_2/O_2$):1.0 or more and 2.5 or less. As the flame temperature zone length increases, $Q_4/Q_3$ tends to increase. As $H_2/O_2$ increases, $Q_4/Q_3$ tends to decrease.

The shape of the silicate-based base material is not particularly limited, for example, the shape may be a spherical shape or plate shape. Furthermore, the size of the silicate-based base material is not particularly limited.

Note here that in a case where a composite to be produced including a crystal of a europium compound and a silicate-based base material is used for bioimaging, from the viewpoint of cytotoxicity, it is preferable that the silicate-based base material has a spherical shape and an average particle size of 50 nm or more and 470 nm or less and is amorphous.

Such a silicate-based base material and europium chloride (III) hexahydrate are mixed such that elemental europium (Eu) with respect to the elemental silicon (Si) of the silicate-based base material is 1.0 mol % or more and subjected to a solid-phase mechanochemical reaction under the load of 4 N or more and 24 N or less. The method is not particularly limited as long as the silicate-based base material and europium chloride (III) hexahydrate can be subjected to a solid-phase mechanochemical reaction under the load of 4 N or more and 24 N or less. For example, a powdery silicate-based base material and europium chloride (III) may be placed in a mortar and pulverized by rotating a pestle while applying a load of 4 N or more and 24 N or less to the pestle. When the above operation is carried out with the mortar mounted on the electronic balance (electronic scale), the load value can be read by the metric indicator of the electronic balance. Furthermore, pulverization may be carried out by mounting europium chloride (III) on a surface of the plate-shaped silicate-based base material and moving the pestle while applying a load of 4 N or more and 24 N or less to the pestle. In this case, by carrying out the above-mentioned operation while a plate-shaped silicate-based base material is mounted on an electronic balance, the load value can be read with a metric indicator of the electronic balance. The load may be within a range of 4 N or more and 24 N or less, but as the load is increased, the crystallinity can be enhanced. When no load or a small load is applied, a crystal of a europium compound of the present invention cannot be obtained.

The percentage of the silicate-based base material with respect to europium chloride hexahydrate needs to be that the percentage of the number of moles of elemental europium (Eu) with respect to the total number of moles of elemental silicon element (Si) of the silicate-based base material and elemental europium (Eu) (number of moles of Eu/(number of moles of Si+number of moles of Eu)) is 1.0 mol % or more, and the percentage of the number of moles of elemental europium (Eu) with respect to the total number of moles of elemental silicon (Si) and elemental europium (Eu) is preferably 1.0 mol % or more and 7.0 mol % or less.

The europium compound is conventionally difficult to be made separately, but according to the production method of the present invention, the compounds represented by chemical formulae (1) to (4) can be separated based on the amount of Eu in the solid-phase mechanochemical reaction. Specifically, in a state in which the concentration of europium during a solid-phase mechanochemical reaction is low (in a state in which OH during the reaction is small in amount), the compound represented by the chemical formulae (1) and (2) coexist, and when a multilayer structure starts to be formed according to increase in concentration of europium during reaction, the compound represented by the chemical formula (1) and the compound represented by the chemical formula (2) interact with each other, and tend to be changed into the compounds represented by the chemical formulae (3) and (4). Therefore, the compounds represented by the chemical formulae (1) to (4) can be made separately based on the amount of Eu in the solid-phase mechanochemical reaction. Note here that the compound represented by the chemical formula (3) tends to be generated through the compound represented by the chemical formula (4).

A solid-phase mechanochemical reaction is carried out, and then baking is carried out, and then washing with organic solvent or water is carried out as necessary.

Figure 1:
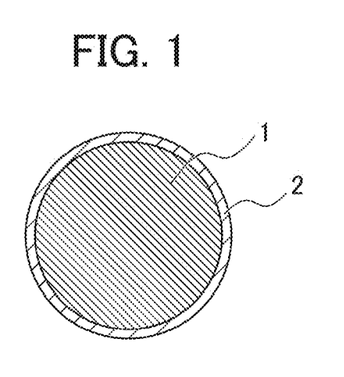
FIG. 1 is a schematic sectional view showing a structure in which an entire surface of a spherical-shaped silicate-based base material is covered with a crystal of a europium compound.

With this production method, a crystal of a europium compound of the present invention is formed on a surface of the silicate-based base material. For example, when the spherical-shaped silicate-based base material is used, a composite having a crystal of a europium compound covering at least a part of the surface of the spherical-shaped silicate-based base material is obtained. As an example, a schematic cross-sectional of the composite in which the entire surface of the spherical-shaped silicate-based base material 1 is covered with a crystal 2 of a europium compound is shown in FIG. 1. When a plate-shaped silicate-based base material is used, a composite having a crystal of a europium compound covering at least a part of the surface of the plate-shaped silicate-based base material is obtained. It is inferred that the crystal of the europium compound strongly binds to the silicate-based base material by some kind of chemical bonds such as a coordination bond between oxygen atoms existing on the surface of the silicate-based base material and a europium atom contained in the europium compound.

<Use of Crystal of Europium Compound>

The crystal of the europium compound of the present invention has low cytotoxicity and functions as a light-emitting substance, and therefore, can be preferably used, for example, for a bioimaging technique. For example, a crystal of a europium compound of the present invention can be used for bioimaging technique as a composite of the crystal of the europium compound and a spherical-shaped silicate-based base material used for producing thereof (hereinafter, also referred to as "light-emitting nanoparticle").

The light-emitting nanoparticle to be used for bioimaging technique preferably includes a hydroxyl group (OH group) on the surface thereof. Also preferably, the surface of the light-emitting nanoparticle is modified by an amino group, and, for example, may also be formed using a silane coupling agent containing an amino group. When silicate-based base material has pores, the OH group and the amino group may be on the inner surface of the pores, but preferably on the outer surface of the pores. When the OH group or the amino group is fixed by a hydrogen bond or a covalent bond by a condensation polymerization to the cell binding molecule, and the surface of the light-emitting nanoparticle is modified by the cell binding molecule, the cell binding molecule can specifically bind to a cancer cell or a normal cell. When the cell binding molecule specifically binds to a cell, the light-emitting nanoparticle is taken up into the cell. Thus, the light-emitting nanoparticle is made to emit light inside the cell, and a cancer cell or the like can be detected.

Examples of the cell binding molecule include an HER2 antibody, antibodies specifically binding to human epidermal growth factor receptor, cancer-specific antibodies, phosphorylation protein antibodies, folic acid, antibodies specifically binding to folic acid receptor β, vascular endothelial cell-specific antibodies, tissue-specific antibodies, transferrin, transferrin-bonding peptide, proteins having affinity to sugar chains, and the like. Among these, folic acid, having a tendency to be taken up by cancer cells, is preferably used as the cell binding molecule. Folic acid receptors are over-expressed on cell membranes for cancer cells, resulting in a tendency of selectively binding to and taking up folic acid molecules.

Furthermore, the surface of the light-emitting nanoparticle may be modified by an anticancer agent molecule. When the anticancer agent molecule specifically binds to the cancer cell, the light-emitting nanoparticle will be taken up into the cell. In this way, the light-emitting nanoparticle inside the cell is allowed to emit light and can detect cancer cells. Further, the anticancer agent is also taken up by the cell, and the anticancer agent molecule can act, and the proliferation of cancer cells can be suppressed.

The cell binding molecule or anticancer agent molecule are preferably modified and fixed to the surface of the light-emitting nanoparticle by a chemical bond. Examples of the chemical bond include a peptide bond (—CO—NH—), a hydrogen bond, or the like.

A cell can be detected by, for example, introducing the light-emitting nanoparticle into a cell, irradiating the light-emitting nanoparticle with light, and observing the cell. Furthermore, a non-human animal can be treated by administering the light-emitting nanoparticle to a non-human animal and irradiating the light-emitting nanoparticle with light. Furthermore, the medical device may include a testing portion for carrying out testing of an internal cell, a diagnosis portion for carrying out diagnosis of the internal cell, and/or a treatment portion for carrying out treatment of an internal cell and may further include a light irradiation portion which introduces the light-emitting nanoparticles into the internal cell, and irradiates the light-emitting nanoparticles with light in carrying out the testing, diagnosis, and/or treatment. Herein, examples of the testing portion for carrying out testing of an internal cell include a fluorescence endoscope for carrying out precision image diagnosis. Furthermore, examples of the diagnosis portion for carrying out diagnosing of an internal cell include a device for carrying out tissue biopsies. Furthermore, examples of the treatment portion for carrying out treatment of an internal cell include a device for extracting a tumor site by endoscopy. Furthermore, examples of the internal cell include cancer cells pertaining to oral cavity cancer, pharyngeal cancer, esophageal cancer, large intestinal cancer, small intestinal cancer, lung cancer, breast cancer, and bladder cancer.

Furthermore, the crystal of the europium compound of the present invention can be used for applications other than the bioimaging application, and, for example, applications of light emitting devices such as a light emitting diode are expected.

EXAMPLES

Hereinafter, the present invention will be described with reference to Examples in more detail, but the present invention is not necessarily limited by these examples.

(Production of Silicate-Based Base Material 1)

Silicon tetrachloride as a raw material was subjected to hydrolysis reaction sufficiently in an oxygen-hydrogen flame to produce silica glass as porous synthetic quartz glass (soot body). At this time, particles that did not become porous synthetic quartz glass after hydrolysis in an oxygen-hydrogen flame and desorbed from the flame were used as the silicate-based base material 1. Note here that silicon tetrachloride was introduced from the center portion of the oxygen-hydrogen flame burner, and the length of the flame temperature zone of 1000° C. or more was 400 mm, and the volume ratio ($H_2/O_2$) of hydrogen to oxygen was 1.5.

($Q_4/Q_3$ of Silicate-Based Base Material in Solid $^{29}$Si-NMR Spectrum)

Figure 2:
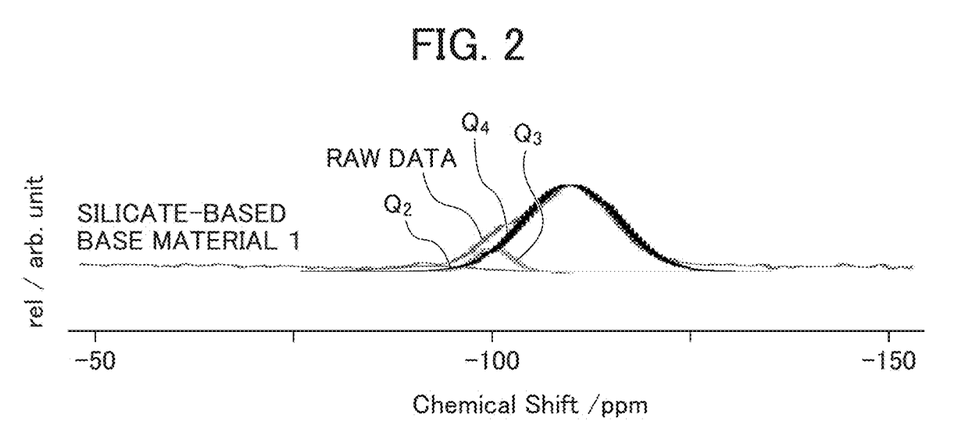
FIG. 2 shows a solid $^{29}$Si-NMR spectrum of the silicate-based base material 1.

For the obtained silicate-based base material 1, the solid $^{29}$Si-NMR spectrum was measured in the following conditions. The results are shown in FIG. 2.

<Measurement Conditions>

Name of device: Bruker Advance 300wbs spectrometer (manufactured by BRUKER)
    Measurement method: DD (Dipolar Decoupling) method
    Sample tube: 7 mm
    Number of revolution of sample: 5000 rpm
    Resonance frequency: 59.62 MHz
    Pulse width: 4.5 msec.

Waiting time: 60 sec
Multiplication time: 1000 times
Reference sample: hexamethylcyclotrisiloxane (−9.55 ppm)

<Peak Separation Method>
(Formation Method of Base Line)
Operation (1): An average value 1 of strength in a range of −70 to −79 ppm, and an average value 2 of strength in a range of −131 to −140 ppm are measured
Operation (2): A straight line passing through two points (−70 ppm, average value 1) and (−140 ppm, average value 2) is defined as a base line
Operation (3): The base line value is deleted from the spectrum (Peak Separation Method)
Separation method: Solver function of Microsoft Office 2016 Excel (registered trademark)
Used function: Gaussian function (in the formula, A denotes a peak height, B denotes a peak position, and C denotes a half value width)

$$f(x) = A \exp\left\{-\frac{(x-B)^2}{C^2}\right\}$$ [Math. 1]

Peak Assignment:
$Q_2$: −91±2 ppm, two ≡Si—O—Si≡ bonds and two ≡Si—OH bonds
$Q_3$: −100±2 ppm, three ≡Si—O—Si≡ bonds and one ≡Si—OH bond
$Q_4$: −110±2 ppm, four ≡Si—O—Si bonds Initial conditions of A, B, and C:
$Q_2$: A=100000, B=−91, C=4
$Q_3$: A=400000, B=−100, C=5.5
$Q_4$: A=960000, B=−110, C=5.5

From FIG. 2, for a silicate-based base material 1, the obtained spectrum was defined as raw data, and the raw data were subjected to spectrum separation as mentioned above. When, in the solid $^{29}$Si-NMR spectrum, a peak area derived from Si(OSi)$_4$ was defined as $Q_4$ and a peak area derived from HO—Si(OSi)$_3$ was defined as $Q_3$, $Q_4/Q_3$ was 2.4. Note here that $Q_2$ shown in FIG. 2 is a peak derived from (HO)$_2$—Si(OSi)$_2$.

<Measurement of Powder X-Ray Diffraction Pattern of Silicate-Based Base Material>

Figure 3:
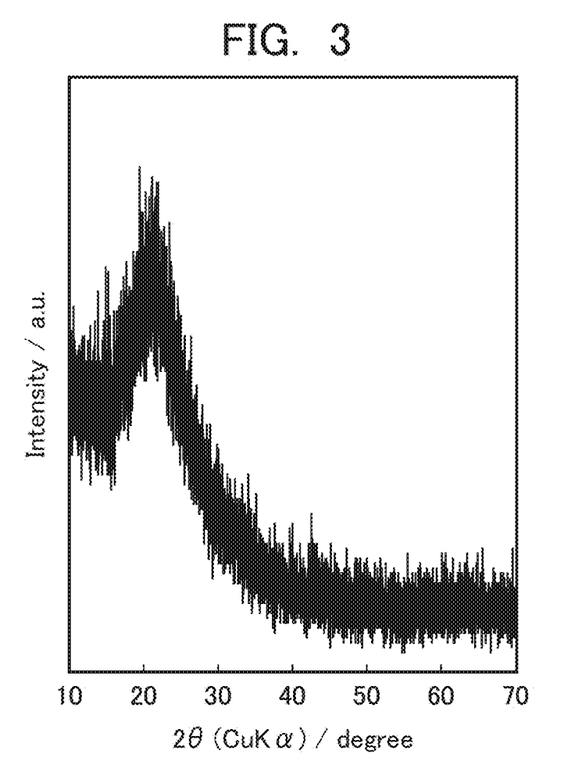
FIG. 3 shows a powder X-ray diffraction pattern of the silicate-based base material 1.

For the silicate-based base material 1, the powder X-ray diffraction (XRD) pattern was measured. The measurement was carried out using a sample horizontal type X-ray diffractometer (XRD) (Smart Lab manufactured by Rigaku Corporation), under the conditions of X radiation source: CuKα radiation source (λ: 1.5418 Å), output: 40 kV/30 mA, scanning speed: 3.0°/min, sampling width: 0.01°, and measurement mode: continuous. The result is shown in FIG. 3. As a result, in the silicate-based base material 1, the half value width of the amorphous halo pattern in the vicinity of 2θ=20° was large such as 6.7°, and a peak derived from crystal was not observed, showing an amorphous.

(Measurement of Average Particle Size of Silicate-Based Base Material)

Figure 4A:
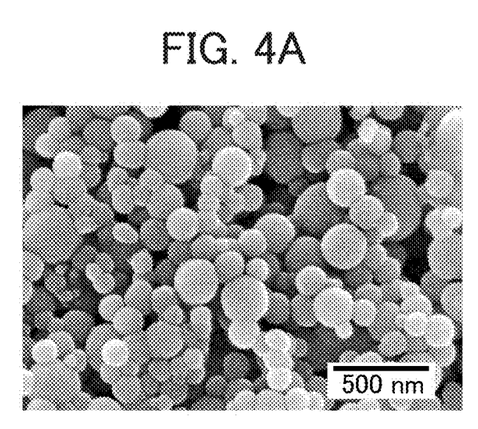
FIGS. 4A and 4B show measurement results of an average particle size by a field emission type scanning electron microscope (FE-SEM) of a silicate-based base material 1.
Figure 4B:
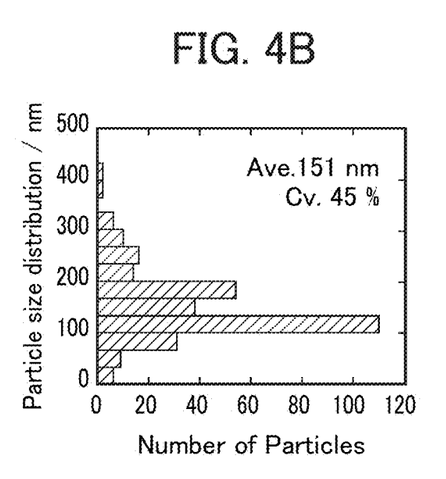

The silicate-based base material 1 (particle powder) was fixed to a sample stand for observation with carbon paste, and dried. Next, particles were observed under a field emission scanning electron microscope (FE-SEM) (SU8230 manufactured by Hitachi High-Technologies, Ltd.), 100 or more of particle diameters were measured, and an average particle size was calculated. Specifically, for 300 particles, the longer diameter and the shorter diameter of each particle were measured, and "(longer diameter+shorter diameter)/2" was defined as a particle diameter (particle size) of each particle. An average value of the particle diameter of each particle (a value obtained by dividing the total values of the particle diameter of each particle by number of particles (300)) was defined as an average particle size (Ave.), and coefficient of variance (Cv.) was calculated. The results are shown in FIG. 4A and FIG. 4B. As a result, the silicate-based base material 1 had an average particle size of 151 nm, and the coefficient of variance of 45%.

Example 1

Figure 5:
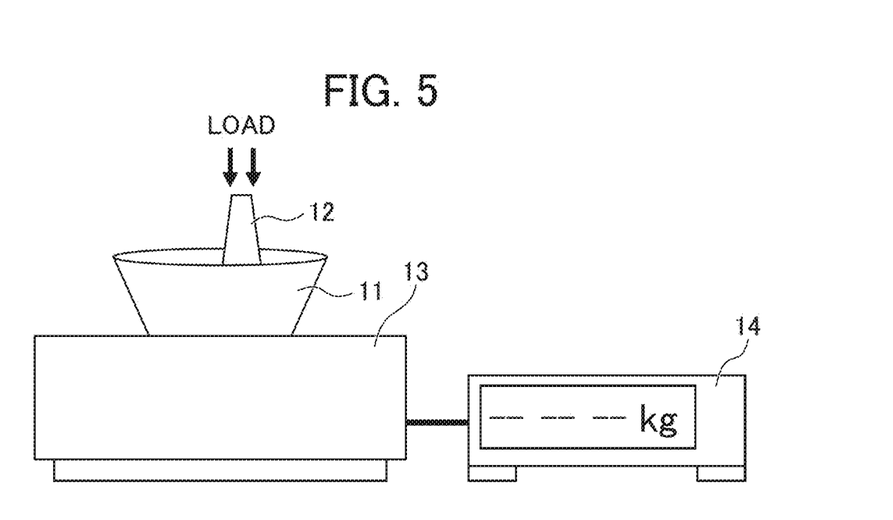
FIG. 5 is a schematic side view for illustrating a production device used for a production method of Example 1.

FIG. 5 is a schematic side view for illustrating a production device used in the production method of Example 1. As shown in FIG. 5, pulverization was carried out in an agate mortar 11 having a hemispherical recess space (diameter: 65 mm, and depth: 30 mm) and an 80-mm pestle 12 having a hemispherical protrusion (tip-end diameter: 20 mm, and height: 5 mm), the silicate-based base material and the europium chloride (III) hexahydrate were subjected to a solid-phase mechanochemical reaction under the load of 4 N. Specifically, europium chloride hexahydrate (EuCl$_3$.6H$_2$O, manufactured by Wako Pure Chemical Industries, Ltd., special grade agent, purity: 99.9 wt. %) was added to 0.4 g (6.66 mmol) of the silicate-based base material 1 which had been dried at 120° C. for 24 hours in the mortar 11, such that the percentage of the number of moles of Eu with respect to the total number of moles of Si and Eu (number of moles of Eu/(number of moles of Si+number of moles of Eu)) was 5.0 mol %. Then, for 5 minutes, the pestle 12 was revolved on the circumference of a radius of 25 mm in the recessed space in the mortar 11 by the pestle 12 without rotating the pestle 12 itself. The pestle 12 was revolved at 120 rotating/min with load of 4 N applied to the pestle 12. Note here that the above operation was carried out in a state in which the mortar 11 was mounted on an electronic balance 13, the load value was read by using the metric indicator 14 of the electronic balance 13. The obtained powder was dried at 120° C. for two hours, and then baked at 550° C. for 6 hours. Thereafter, the obtained product was washed with 40 mL of ethanol, and subjected to solid-liquid separation by centrifugation, and the solid phase was dried at 120° C. for two hours to obtain the particles (spherical-shaped powder) of Example 1.

Example 2

Particles of Example 2 were obtained by carrying out the same operation as in Example 1 except that europium chloride hexahydrate was added such that the percentage of the number of moles of Eu with respect to the total number of moles of Si and Eu was 2.5 mol %.

Example 3

Particles of Example 3 were obtained by carrying out the same operation as in Example 1 except that europium chloride hexahydrate was added such that the percentage of the number of moles of Eu with respect to the total number of moles of Si and Eu was 1.25 mol %.

Comparative Example 1

Particles of Comparative Example 1 were obtained by carrying out the same operation as in Example 1 except that the europium chloride hexahydrate was added such that the percentage of the number of moles of Eu with respect to the total number of moles of Si and Eu was 0.625 mol %.

Comparative Example 2

Europium chloride hexahydrate was used as particles for Comparative Example 2.
<Powder X-Ray Diffraction (XRD)>

Particles of Examples 1 to 3 and Comparative Examples 1 to 2 were subjected to measurement of powder X-ray diffraction (XRD) pattern in the following conditions. Measurement was carried out using the sample horizontal type X-ray diffractometer (XRD, Smart Lab manufactured by Rigaku Corporation) under conditions of X radiation source: CuKα radiation source (λ: 1.5418 Å), output: 40 kV/30 mA, scanning speed: 3.0°/min, sampling width: 0.01°, and measurement mode: continuous. The diffraction peak position, diffraction angle, and half-value width were obtained by software (manufactured by Rigaku Corporation, software name: PDXL) attached to the device. The diffraction peaks were detected by the automatic profiling process of PDXL, by the second-order differential method (a method of detecting a region in which the peak second-order differential is negative (convex upward) as a peak), by removing the background, removing the $K\alpha_2$ line, and smoothing in this order, and fitting with the B-spline function (the split pseudo-Voigt function). The threshold (cut value of the standard deviation) in detecting the diffraction peak was 3.0. The threshold means that the diffraction peak is not regarded as a diffraction peak when the intensity of the diffraction peak is 3.0 times or less of its error. Three points were selected in descending order of the diffraction peak intensity (the height of the diffraction peak) and used for identification of the crystal. Furthermore, the crystallinity was calculated by the above formula (5). The results are shown in Table 1 and FIG. 6. In Table 1, in the upper stage, "m±n" indicating the diffraction angle 2θ in which each diffraction peak is located indicates that the peak top position (diffraction peak top position) of the diffraction peak is m (°), the start point of the diffraction peak is m−n (°), and the end point of the diffraction peak is m+n (°). Specifically, the diffraction peak top was defined as the maximum intensity (maximum height) between the start point and the end point of each diffraction peak when a baseline is drawn from the start point to the end point. The position of the diffraction peak top (diffraction angle) was defined as the diffraction peak top position. In Table 1, the parentheses in the lower row indicate the half value width of each diffraction peak. The half value width indicates the width between diffraction peak positions having an intensity (height) of 50% of the diffraction peak top within the range of "m−n"° to "m+n"°.

Figure 6:
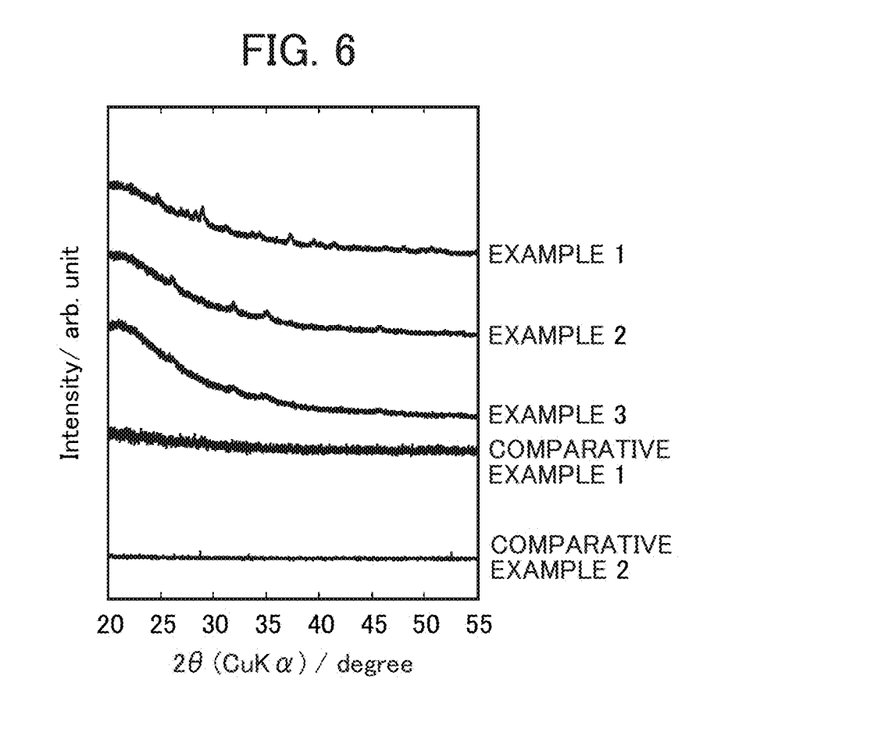
FIG. 6 shows powder X-ray diffraction patterns of particles of Examples and Comparative Examples.

As shown in Table 1 and FIG. 6, Examples 2 to 3 have the powder X-ray diffraction pattern having a diffraction peak (first diffraction peak) in a diffraction angle (2θ) range of 34.3° to 36.1° in which a half value width of the diffraction peak in a diffraction angle (2θ) range of 34.3° to 36.1° was 1.8° or less and included a crystal of the compounds represented by the chemical formula (1) or (2). Note here that x in the chemical formula (1) was 0.2 or more and 0.6 or less. Furthermore, Examples 2 to 3 have a diffraction peak in a diffraction angle (2θ) range of 25.9° to 26.5° and in a diffraction angle (2θ) range of 31.6° to 32.2° in which the half value width of the diffraction peaks both in a diffraction angle (2θ) range of 25.9° to 26.5° and a diffraction angle (2θ) range of 31.6° to 32.2° was 0.6° or less.

Furthermore, Example 1 included a crystal of a compound represented by the chemical formula (3) or (4) having a powder X-ray diffraction pattern including diffraction peaks (second diffraction peak and third diffraction peak) in the diffraction angle (2θ) range of 28.6° to 29.6° and a diffraction angle (2θ) range of 36.8° to 38.4° in which the half-value width of the diffraction peak in the diffraction angle (2θ) range of 28.6° to 29.6° was 1.0° or less and the half-value width of the diffraction peak in the diffraction angle (2θ) range of 36.8° to 38.4° was 1.6° or less. Furthermore, Example 1 had diffraction peaks in the diffraction angle (2θ) range of 39.0° to 40.2° in which the half-value width of the diffraction peak in the diffraction angle (2θ) range of 39.0° to 40.2° was 1.2° or less. Furthermore, as shown in Table 1 and FIG. 6, in the particles obtained in Examples 1 to 3, crystallinity was more than 0, and the crystal of the europium compound was formed on the surface, while the particles of Comparative Examples 1 to 2 were amorphous.

TABLE 1

|  | Example 1 | Example 2 | Example 3 | Comparative Example 1 | Comparative Example 2 |
|---|---|---|---|---|---|
| Diffraction angle (2θ) in which diffraction peak is located: degree (Half value width: degree) | 24.8 ± 0.4 (0.50) | 26.2 ± 0.3 (0.34) | 26.2 ± 0.3 (0.34) | — | — |
|  | 27.5 ± 0.3 (0.37) | 31.9 ± 0.3 (0.37) | 31.9 ± 0.3 (0.36) |  |  |
|  | 28.3 ± 0.3 (0.38) | 35.2 ± 0.9 (1.06) | 35.2 ± 0.9 (1.09) |  |  |
|  | 29.1 ± 0.5 (0.59) | 45.9 ± 0.5 (0.61) | 45.9 ± 0.5 (0.59) |  |  |
|  | 31.6 ± 0.6 (0.73) |  |  |  |  |
|  | 34.5 ± 0.4 (0.49) |  |  |  |  |
|  | 37.6 ± 0.8 (0.95) |  |  |  |  |
|  | 39.6 ± 0.6 (0.73) |  |  |  |  |
|  | 41.4 ± 0.6 (0.72) |  |  |  |  |
|  | 48.1 ± 0.4 (0.50) |  |  |  |  |
| Crystallinity | 0.41 | 0.12 | 0.11 | 0.000 | 0.000 |

<Light-Emitting Property>

An excitation spectrum and a fluorescence spectrum of particles of Examples 1 to 3 were measured under the following conditions.

Excitation Spectrum

The excitation spectrum was obtained by fixing the detection wavelength (615 nm) with a spectrophotometer (PL, FP-8500 manufactured by JASCO Corporation). The measurement conditions were atmosphere: air, excitation/detection slit size: 2.5 nm/2.5 nm, step width: 1.0 nm, sample weight: 20 mg, shape: pellet.

Fluorescence Spectrum

The sample was irradiated with excitation light from the Xe lamp using a spectrophotometer (PL, FP-8500 manufactured by JASCO Corporation) at room temperature (excitation wavelength: 395 nm), and a PL spectrum (fluorescence spectrum) was obtained. The measurement conditions were atmosphere: air, excitation/detection slit size: 2.5 nm/2.5 nm, step width: 1.0 nm, sample weight: 20 mg, shape: pellet.

Figure 7A:
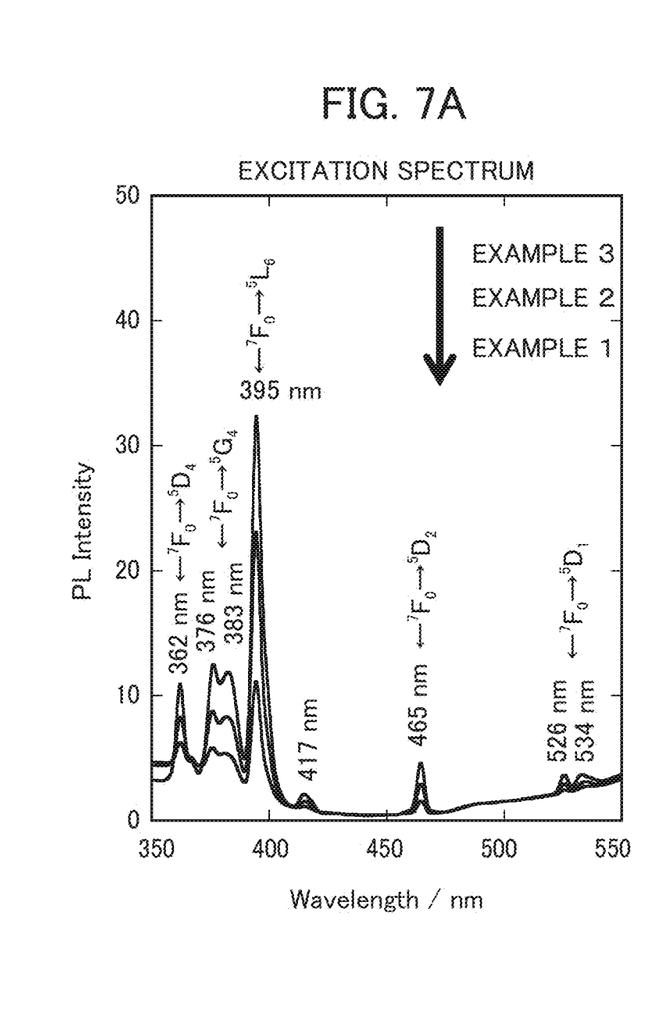
FIG. 7A and FIG. 7B show excitation spectra and fluorescence spectra of particles of Examples.
Figure 7B:
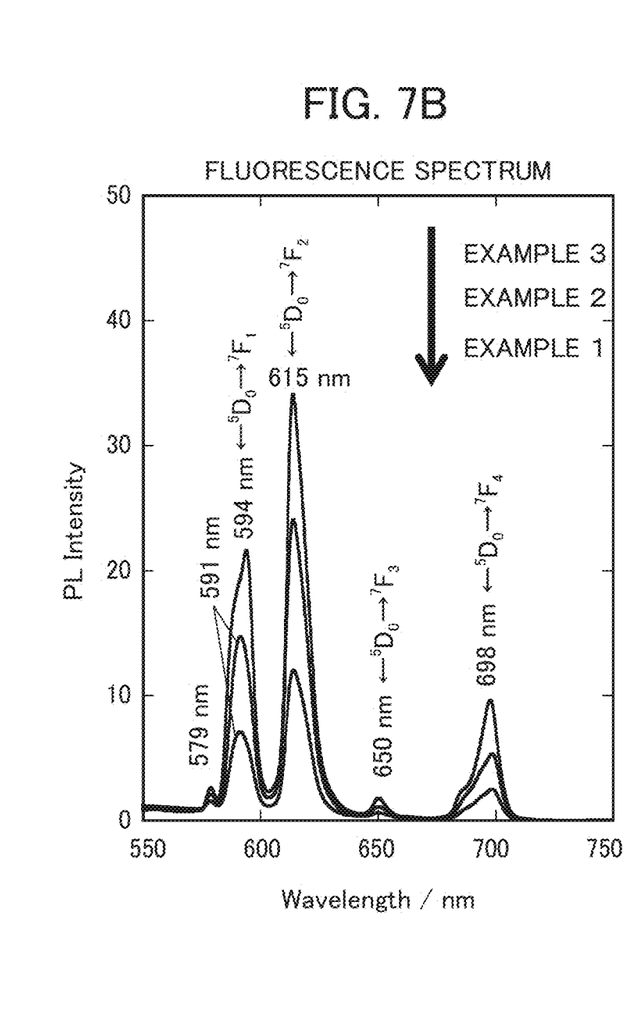

As shown in FIG. 7A and FIG. 7B, in all of Examples 1 to 3, excitation peak derived from Eu(III) ion ($^7F_0 \rightarrow {}^5D_4$ transition, $^7F_0 \rightarrow {}^5G_4$ transition, $^7F_0 \rightarrow {}^5L_6$ transition, $^7F_0 \rightarrow {}^5D_2$ transition, and $^7F_0 \rightarrow {}^5D_1$ transition) and light-emitting peak ($^5130 \rightarrow {}^7F_1$ transition, $^5D_0 \rightarrow {}^7F_2$ transition, $^5D_0 \rightarrow {}^7F_3$ transition, $^5D_0 \rightarrow {}^7F_4$ transition) were observed. Furthermore, from FIG. 7A and FIG. 7B, the internal quantum yields of the particles of particles of Examples 1 to 3 at the excitation wavelength $\lambda_{ex}$=395 nm and the emission wavelength $\lambda_{ex}$=615 nm were respectively 1.0 to 4.0%.

Example 4

Particles of Example 4 were obtained by the same operation as in Example 1 except that the load was made to be 8.0 N.

Example 5

Particles of Example 5 were obtained by the same operation as in Example 1 except that the load was made to be 12.0 N.

Figure 8:
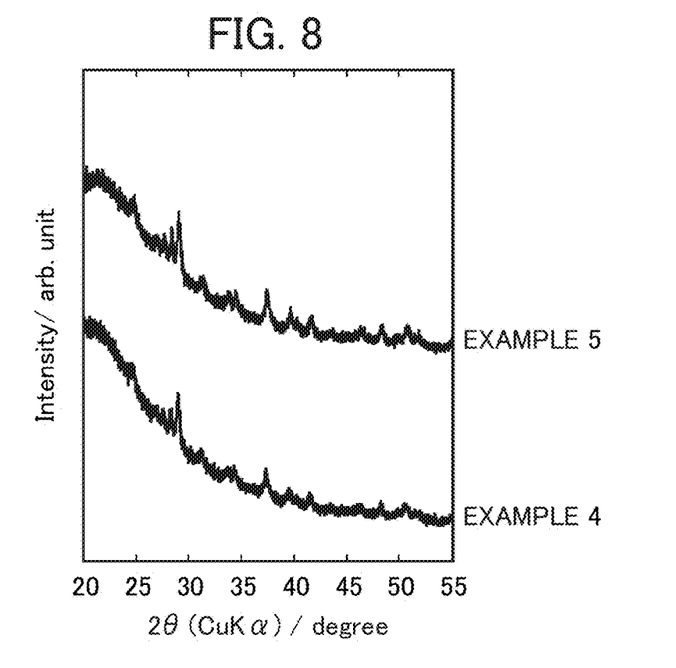
FIG. 8 shows powder X-ray diffraction patterns of particles of Examples.

For the particles of Examples 4 to 5, results obtained in the same manner as in <Powder X-ray diffraction (XRD)> mentioned above are shown in Table 2 and FIG. 8. As shown in Table 2 and FIG. 8, both Examples 4 to 5 included a crystal of the compound represented by the chemical formula (3) or (4) having diffraction peaks (a second diffraction peak and a third diffraction peak) in a diffraction angle (2θ) range of 28.6° to 29.6° and the diffraction angle (2θ) range of 36.8° to 38.4° in which a half value width of the diffraction peak in the range of the diffraction angle (2θ) range of 28.6° to 29.6° was 1.0° or less, a half value width of the diffraction peak in the range of the diffraction angle (2θ) range of 36.8° to 38.4° was 1.6° or less. Furthermore, both Examples 4 to 5 had a diffraction peak in a diffraction angle (2θ) range of 39.0° to 40.2°, in which a half value width in a diffraction angle (2θ) range of 39.0° to 40.2° was 1.2° or less. As shown in Table 2 and FIG. 8, particles obtained in both of Examples 4 to 5 had crystallinity of more than 0 and had a crystal of a europium compound on the surface thereof. As shown in Table 2 and FIG. 8, it is found that as the load is increased, the crystallinity can be enhanced.

TABLE 2

| | Example 4 | Example 5 |
|---|---|---|
| Diffraction angle (2θ) in which diffraction peak is located: degree (Half value width: degree) | 24.8 ± 0.6 (0.70) | 24.8 ± 0.5 (0.61) |
| | 27.0 ± 0.1 (0.14) | 27.0 ± 0.1 (0.13) |
| | 27.5 ± 0.3 (0.31) | 27.5 ± 0.3 (0.37) |
| | 28.3 ± 0.3 (0.30) | 28.3 ± 0.3 (0.36) |
| | 29.1 ± 0.5 (0.54) | 29.1 ± 0.5 (0.54) |
| | 31.3 ± 0.3 (0.41) | 31.3 ± 0.3 (0.41) |
| | 34.5 ± 0.5 (0.64) | 34.5 ± 0.3 (0.38) |
| | 37.4 ± 0.6 (0.73) | 37.4 ± 0.7 (0.84) |
| | 39.4 ± 0.5 (0.60) | 39.4 ± 0.6 (0.72) |
| | 41.6 ± 0.5 (0.58) | 41.6 ± 0.6 (0.72) |
| | 46.4 ± 0.7 (0.79) | 46.4 ± 0.8 (0.91) |
| | 48.2 ± 0.5 (0.54) | 48.2 ± 0.5 (0.54) |
| | 50.6 ± 0.3 (0.40) | 50.6 ± 0.4 (0.48) |
| | 51.8 ± 0.5 (0.64) | 51.8 ± 0.4 (0.52) |
| Crystallinity | 0.51 | 0.52 |

Particles of Examples 1 to 3 or Comparative Examples 1 to 2 were subjected to toxicity evaluation by cancer cell imaging and fluorescence intensity measurement by the following methods.

(Modification of Cancer Cell Binding Molecule (Folic Acid Derivative FA-NHS) to Particle)

To 250 mg of the particles of Examples 1 to 3 or Comparative Examples 1 to 2, 12 ml of an HCl aqueous solution (pH=2) was added, and ultrasonic treatment was carried out. Next, a solution containing 0.78 ml (3.3 mmol) of 3-aminopropyltriethoxysilane (APTES) in 5 mL of ethanol was prepared and added to the ultrasonic-treated solution to obtain a mixed solution. The mixed solution was stirred for 20 hours at 40° C. (pH<6.5). After the stirring was completed, the mixed solution was centrifuged and washed with ethanol. After washing, drying was carried out under reduced pressure to obtain 150 mg of particles having a surface modified with APTES. To 150 mg of these particles having a surface modified with APTES, 25 mL of a 50 mM phosphate buffer solution (pH=7.0) was added, and ultrasonic treatment was carried out. Next, a solution containing 430 mg (0.8 mmol) of FA-NHS (folic acid derivative) in 12 mL of dimethylsulfoxide (DMSO) was prepared, and the prepared solution was added to the ultrasonic-treated solution to obtain a mixed solution. The mixed solution was stirred for 3 hours at room temperature. After stirring was completed, the mixed solution was centrifuged and washed with water. After washing, drying was carried out under reduced pressure to obtain FA (folic acid)-modified particles of Examples 1 to 3 or Comparative Examples 1 to 2.

(Cell Culture)

Hela cancer cells were cultured in a PS flask (dissemination density: 100×10⁴ cells/37 cm²). Thawing and dissemination were carried out for 7 days. The cells were peeled off and separated. The Hela concentration was (0.99±0.07)×10⁵ cells/mL. Concentration of the cells was adjusted, and 10 vol % FBS (fetal bovine serum) was cultured in DMEM (Dulbecco modification nutrient medium). The obtained cells were 7.5×10⁴ cells per 1 mL. An amount of 2.25 mL/TCPS was disseminated to polystyrene dishes (TCPS) (cultivation area: 9.6 cm²), and the dissemination density was 1.8×10⁴ cells/cm². (Microscope observation). Thereafter, culturing was carried out (temperature: 37° C., $CO_2$ concentration: 5%, humidity: 100%). After 12 hours, FA (folic acid)-modified particles of Examples 1 to 3 or Comparative Examples 1 to 2 were added to 10 vol % DMEM, and dispersed, and the concentration was adjusted to 100 mg/mL.

(Measurement of Cell Density)

After the above cells were cultured, a polystyrene dish (TCPS) including cells was washed twice with 1 ml of phosphate buffered saline (PBS), then FA (folic acid)-modified particles which had not taken up by the cells were removed, 0.1 ml of 0.05% Trypsin-EDTA was placed in a TCPS including cells, followed by allowing to stand still in a $CO_2$ incubator for 12 minutes, and cells were peeled off from TCPS. Peeling was observed, a suspension including cells was taken into a 50-ml conical tube and subjected to centrifugation (2000 rpm, 2 min). After the centrifugation, a supernatant was discarded, 7 ml of culture medium was added to the tube, overturning stirring was carried out about 10 times, and then centrifugation (2000 rpm, 2 min) was carried out. Thereafter, the supernatant was discarded, 20 ml of medium was added to the tube, pipetting was carried out about 20 times, 1 ml was aliquoted into 15 ml-tubes, the cell suspension was placed into a disposable hemocytometer using a micropipette outside a clean bench, the cell number was confirmed under a microscope, and the average value (cell/cm²) was calculated. At 3 hours, 12 hours, 24 hours, 36 hours, and 48 hours after spraying FA (folic acid)-modified particles on the cell surface, the average value of cell density was calculated, and the results are shown in FIG. 9.

Figure 9:
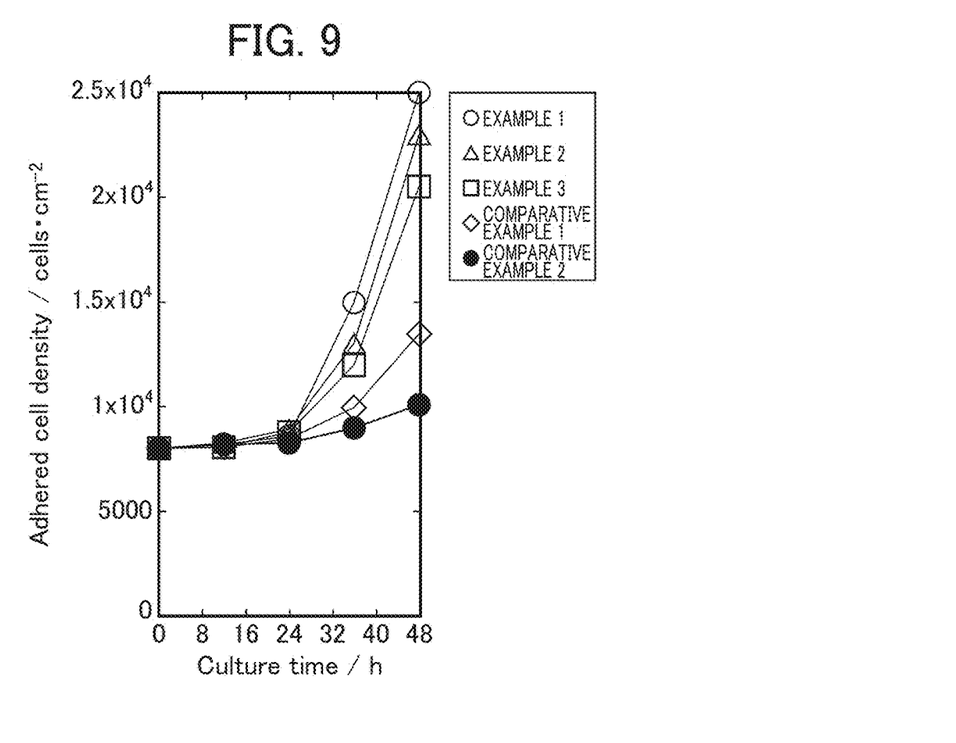
FIG. 9 is a view showing measurement results of cell densities of Examples and Comparative Examples.

As shown in FIG. 9, Examples 1 to 3 in which a crystal of a europium compound was formed on the surface, exhibited normal cell proliferation behavior and no cytotoxicity. In other words, it can be said that, in a case of compounding (compositing) into a spherical silicate-based base material as a crystal, no cytotoxicity was observed. On the other hand, in Comparative Example 2, a normal cell proliferation behavior was not observed, and it is considered that since the amorphous $EuCl_3 \cdot 6H_2O$ is independently an unstable chloride, it eluted into the cell culture solution to form Eu ion or Eu chloride ion and reacted directly with the cells. Similarly, also when the amorphous particles of Comparative Example 1 were used, it is considered that the amorphous were eluted into the cell culture solution to form Eu ions or Eu chloride ions and reacted directly with the cells. Therefore, in the case of an amorphous, it can be said that there is cytotoxicity due to the elution.

As mentioned above, a crystal of the europium compound of the present invention is expected to be suitable for bioimaging in which cells grow well and are taken up into cells and visualized when formed in a composite with a spherical silicate-based base material.

EXPLANATION OF REFERENCE NUMERALS 1 silicate-based base material (spherical shape)
2 crystal of a europium compound

The invention claimed is:

1. A crystal of a europium compound containing europium,
having a powder X-ray diffraction pattern having a first diffraction peak in a diffraction angle (2θ) range of 34.3° to 36.1° in which a half value width of the first diffraction peak is 1.1° or less, and/or having a second diffraction peak in a diffraction angle (2θ) range of 28.6° to 29.6° and a third diffraction peak in a diffraction angle (2θ) range of 36.8° to 38.4° in which a half value width of the second diffraction peak is 0.6° or less and a half value width of the third diffraction peak is 1.0° or less, and
is at least one compound represented by the following chemical formulae (1) to (4):

$$EuCl_x \qquad (1)$$

$$Eu(OH)_2 \qquad (2)$$

$$Eu(OH)_2Cl \qquad (3)$$

$$EuOCl \qquad (4)$$

wherein in the formula (1), x is 0.05 or more and 5 or less.

2. The crystal of a europium compound of claim 1, wherein an excitation wavelength and a light-emission wavelength are in a visible light region.

3. A light emitting compound comprising a composite, the composite comprising the crystal of the europium compound according to claim 1, and
a spherical-shaped silicate-based base material, and the surface of the light-emitting nanoparticle is modified by an amino group.

4. A method for producing the crystal of a europium compound according to claim 1, the method comprising:
mixing a silicate-based base material and europium chloride (III) hexahydrate with each other to carry out a solid-phase mechanochemical reaction,
wherein the silicate-based base material contains elemental silicon (Si) and elemental oxygen (O), and has a solid ²⁹Si-NMR spectrum satisfying $Q_4/Q_3$ of 2.0 to 3.9 where $Q_4$ represents a peak area derived from $Si(OSi)_4$ and $Q_3$ represents a peak area derived from $HO-Si(OSi)_3$, and
the solid-phase mechanochemical reaction is carried out by adding the europium chloride (III) hexahydrate such that a percentage of a number of moles of elemental europium with respect to a total number of moles of elemental silicon of the silicate-based base material and elemental europium is 1.0 mol % or more, and under a load of 4 N or more and 24 N or less.

* * * * *